US011128117B2

(12) United States Patent
Takahashi et al.

(10) Patent No.: US 11,128,117 B2
(45) Date of Patent: Sep. 21, 2021

(54) PROTECTION CIRCUIT AND OPERATIONAL METHOD OF THE PROTECTION CIRCUIT, AND SEMICONDUCTOR INTEGRATED CIRCUIT APPARATUS (71) Applicant: Rohm Co., Ltd., Kyoto (JP)

(72) Inventors: Naoki Takahashi, Kyoto (JP); Shuntaro Takahashi, Kyoto (JP); Toru Takuma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 573 days.

(21) Appl. No.: 16/042,637

(22) Filed: Jul. 23, 2018

(65) Prior Publication Data

US 2018/0331093 A1 Nov. 15, 2018

Related U.S. Application Data (63) Continuation of application No. PCT/JP2017/004743, filed on Feb. 9, 2017.

(30) Foreign Application Priority Data

Feb. 18, 2016 (JP) .............................. JP2016028508
Feb. 18, 2016 (JP) .............................. JP2016028510

(51) Int. Cl.
*H02H 3/00* (2006.01)
*H02J 7/00* (2006.01)
(Continued)

(52) U.S. Cl.
CPC ......... *H02H 3/003* (2013.01); *H01L 27/0255* (2013.01); *H01L 27/0266* (2013.01);
(Continued)

(58) Field of Classification Search
CPC ........ H02H 3/003; H02H 3/18; H02H 11/003; H02H 9/04–046; H01L 27/0255;
(Continued)

(56) References Cited

U.S. PATENT DOCUMENTS 4,266,178 A * 5/1981 Asakawa ............... G04C 10/02
320/101
5,391,948 A 2/1995 Izumita
(Continued)

FOREIGN PATENT DOCUMENTS

EP 2071724 6/2009
EP 2680439 1/2014
(Continued)

OTHER PUBLICATIONS

European Patent Office; Extended European Search Report mailed in corresponding European Patent Application No. 17753069.8 (dated Oct. 16, 2018).
(Continued)

*Primary Examiner* — Jared Fureman
*Assistant Examiner* — Christopher J Clark
(74) *Attorney, Agent, or Firm* — Fish & Richardson P.C.

(57) ABSTRACT

A protection circuit includes: a high-side switch connected to a power terminal to which a predetermined power supply voltage VBB is supplied from an onboard battery; and an NMOS transistor MT1 connected to the high-side switch and configured to prevent an electrical conduction to the high-side switch when the onboard battery is reverse-connected to the power terminal, wherein a semiconductor integrated circuit is protected from a breakdown due to the reverse connection of the external power supply. A semiconductor integrated circuit apparatus includes the above-mentioned protection circuit configured to protect a semiconductor integrated circuit connected between the power
(Continued)

terminal and the ground terminal, from an electro-static discharge breakdown. The protection circuit is connected to the clamp circuit unit inserted between the power terminal and the ground terminal, and is configured to protect the clamp circuit unit from a breakdown when the external power supply is reverse-connected.

16 Claims, 7 Drawing Sheets (51) Int. Cl.
*H01L 27/02* (2006.01)
*H02H 9/04* (2006.01)
*H02H 11/00* (2006.01)
*H03K 17/08* (2006.01)
*H01L 29/866* (2006.01)

(52) U.S. Cl.
CPC ......... *H01L 29/866* (2013.01); *H02H 11/003* (2013.01); *H02J 7/0034* (2013.01); *H03K 17/08* (2013.01); *H01L 27/0262* (2013.01); *H02H 9/042* (2013.01)

(58) Field of Classification Search
CPC .... H01L 27/0266; H01L 27/0248–0296; H02J 7/0034
See application file for complete search history.

(56) References Cited

U.S. PATENT DOCUMENTS

| | | | |
|---|---|---|---|
| 6,392,463 | B1 | 5/2002 | Kitagawa et al. |
| 2005/0068705 | A1 | 3/2005 | Nakahara |
| 2009/0146628 | A1 | 6/2009 | Nakahara |
| 2013/0188287 | A1* | 7/2013 | Imura ................... H02H 3/18 361/56 |
| 2014/0002936 | A1* | 1/2014 | Sawataishi ....... H03K 19/00315 361/56 |

FOREIGN PATENT DOCUMENTS

| | | |
|---|---|---|
| JP | 06-90520 | 3/1994 |
| JP | 2525450 Y2 | 11/1996 |
| JP | 2001-160748 | 6/2001 |
| JP | 2004-031980 A | 1/2004 |
| JP | 2004-173292 A | 6/2004 |
| JP | 2005-109162 | 4/2005 |
| JP | 2009-147995 | 7/2009 |
| JP | 2011-101188 A | 5/2011 |
| JP | 2012-90108 | 5/2012 |
| JP | 2014-11233 | 1/2014 |
| JP | 2014-82922 A | 5/2014 |

OTHER PUBLICATIONS

Japan Patent Office, International Search Report for PCT/JP2017/004743 dated May 9, 2017.

Japanese Patent Office; Official Action mailed in counterpart Japanese patent application No. 2018-500075 with machine translation (dated Oct. 6, 2020).

* cited by examiner

PROTECTION CIRCUIT AND OPERATIONAL METHOD OF THE PROTECTION CIRCUIT, AND SEMICONDUCTOR INTEGRATED CIRCUIT APPARATUS

CROSS REFERENCE TO RELATED APPLICATIONS

This is a continuation application (CA) of PCT Application No. PCT/JP2017/4743, filed on Feb. 9, 2017, which claims priority to Japan Patent Applications No. P2016-28508 filed on Feb. 18, 2016 and No. P2016-28510 filed on Feb. 18, 2016 and is based upon and claims the benefit of priority from prior Japanese Patent Applications No. P2016-28508 filed on Feb. 18, 2016, No. P2016-28510 filed on Feb. 18, 2016 and PCT Application No. PCT/JP2017/4743, filed on Feb. 9, 2017, the entire contents of each of which are incorporated herein by reference.

FIELD

The embodiments described herein relate a protection circuit and an operational method of such a protection circuit, and a semiconductor integrated circuit apparatus.

BACKGROUND

For Integrated Circuits (IC), in particular onboard ICs (in-vehicle ICs), a protection function for ICs not to be broken down should be required even when onboard batteries (in-vehicle batteries) are reverse-connected.

Generally, an externally connected-diode is commonly inserted, as countermeasures against the reverse connection.

SUMMARY

The embodiments provide: a protection circuit capable of protecting a semiconductor integrated circuit from a breakdown due to reverse connection of external power supply and realizing a voltage reduction of an applied voltage; and an operational method of such a protection circuit.

The embodiments provide: a protection circuit capable of protecting a semiconductor integrated circuit from an electro-static discharge breakdown, and protecting the semiconductor integrated circuit also from a breakdown due to reverse connection of external power supply; and a semiconductor integrated circuit apparatus including such a protection circuit.

According to one aspect of the embodiments, there is provided a protection circuit comprising: a semiconductor integrated circuit connected to a power terminal, a predetermined power supply voltage being supplied to the power terminal from an external power supply; and a switch connected to the semiconductor integrated circuit, the switch configured to prevent an electrical conduction to the semiconductor integrated circuit when the external power supply is reverse-connected to the power terminal, wherein the semiconductor integrated circuit is protected from a breakdown.

According to another aspect of the embodiments, there is provided an operational method of a protection circuit configured to protect from a breakdown a semiconductor integrated circuit connected to a power terminal, a predetermined power supply voltage being supplied to the power terminal from an external power supply, the operational method comprising: interrupting a current path between a ground (earth) terminal and the power terminal by means of a switch when the external power supply is reverse-connected to the power terminal.

According to still another aspect of the embodiments, there is provided the above-mentioned protection circuit, wherein the protection circuit is connected to a clamp circuit unit inserted between the power terminal and the ground (earth) terminal, and protects the clamp circuit unit from a breakdown when the external power supply is reverse-connected to the power terminal. Moreover, according to yet another aspect of the embodiments, there is provided a semiconductor integrated circuit apparatus comprising the aforementioned protection circuit, the protection circuit configured to protect a semiconductor integrated circuit connected between a power terminal and a ground (earth) terminal from an electro-static discharge breakdown, a predetermined power supply voltage being supplied from an external power supply to the power terminal.

According to the embodiments, there can be provided: the protection circuit capable of protecting the semiconductor integrated circuit from the breakdown due to reverse connection of external power supply and realizing the voltage reduction of the applied voltage; and the operational method of such a protection circuit.

According to the embodiments, there can be provided: the protection circuit capable of protecting the semiconductor integrated circuit from the electro-static discharge breakdown, and protecting the semiconductor integrated circuit also from the breakdown due to reverse connection of external power supply; and the semiconductor integrated circuit apparatus including such a protection circuit.

DESCRIPTION OF EMBODIMENTS

Next, certain embodiments will now be explained with reference to drawings. In the description of the following drawings, the identical or similar reference numeral is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

In addition, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

In the following explanation, although a case where an integrated circuit (IC) is applied as an onboard IC will be explained, it is merely an example.

Note that a case where an onboard battery is normally connected so that a predetermined power supply voltage may be supplied to a power terminal is defined as a normal state (or normal connection state), and a case where the onboard battery is connected conversely therefrom (reverse-connected thereto) is defined as a reverse connection state.

[Configuration of Protection Circuit]

Figure 1A:
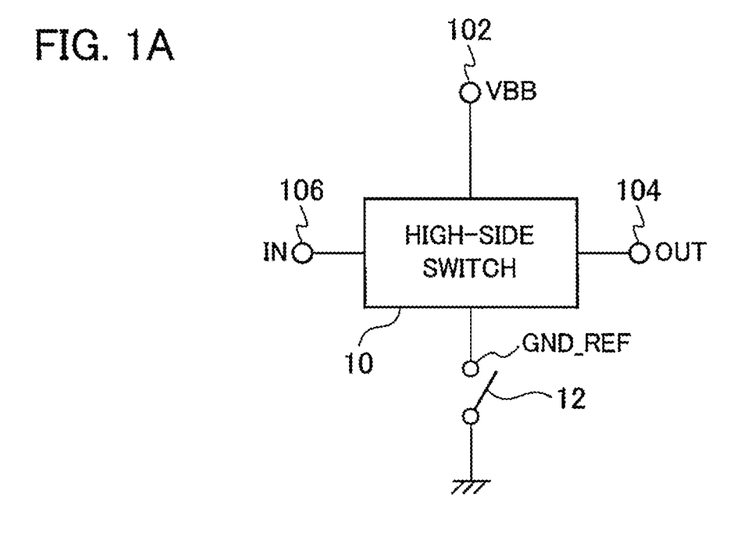
FIG. 1A is a schematic structure diagram of an onboard IC (in-vehicle IC) capable of mounting a protection circuit according to the embodiments.
Figure 1B:
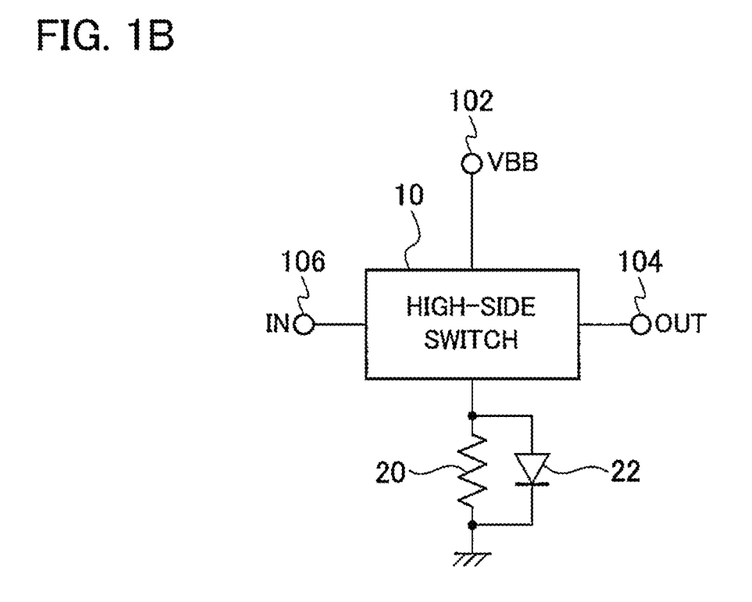
FIG. 1B is a schematic structure diagram of an onboard IC capable of mounting a protection circuit according to a comparative example.

FIG. 1A shows a schematic structure of an onboard IC (integrated circuit) capable of mounting a protection circuit according to the embodiments. Moreover, FIG. 1B shows a schematic structure of an onboard IC capable of mounting a protection circuit according to a comparative example.

More specifically, as shown in FIG. 1A, the onboard IC capable of mounting the protection circuit according to the embodiments, includes: a high-side switch 10 as a semiconductor integrated circuit connected to a power terminal 102; and a protection circuit 12 configured to prevent an electrical conduction to the high-side switch 10 when an onboard battery (not shown) which is an external power supply is reverse-connected thereto.

Figure 2:
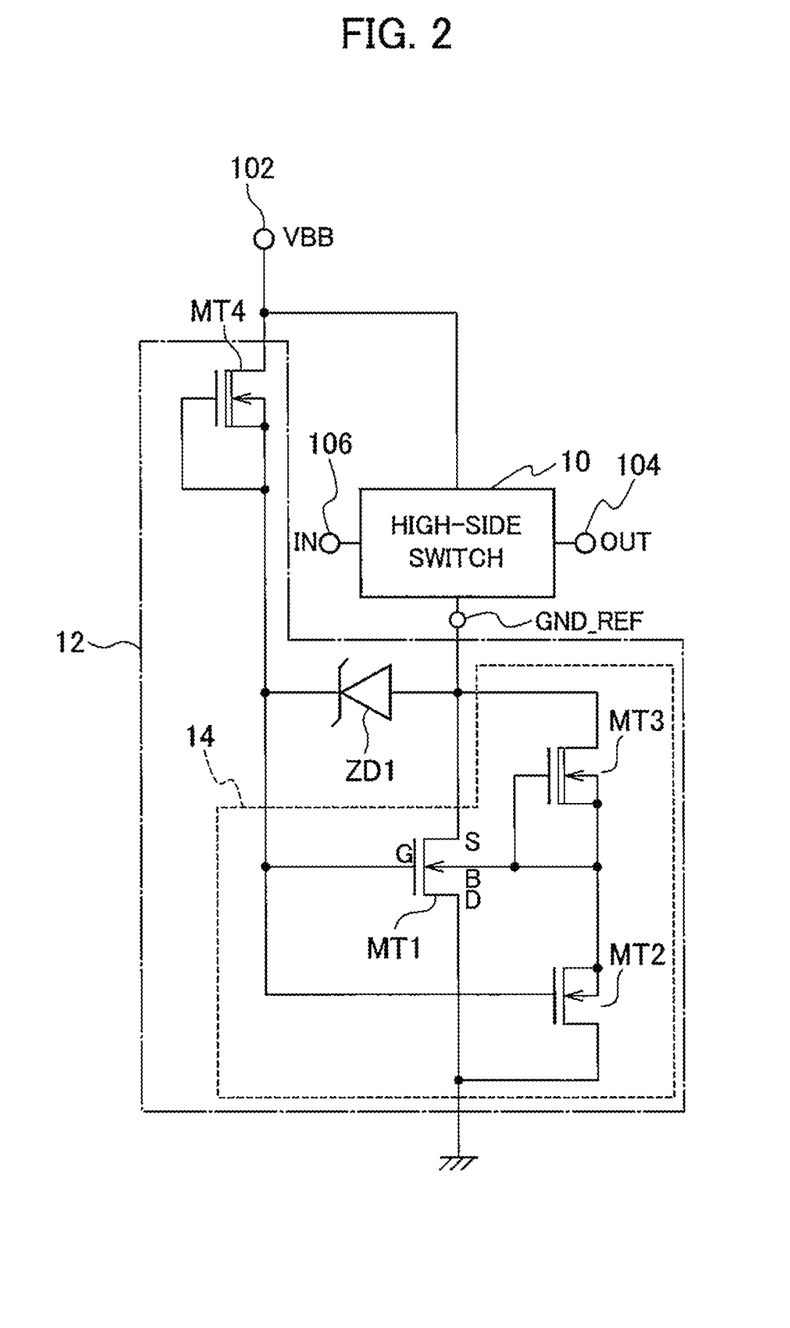
FIG. 2 is a circuit configuration diagram showing a concrete example of the protection circuit shown in FIG. 1.

As shown also in FIG. 2, the protection circuit 12 according to the embodiments includes: a semiconductor integrated circuit (high-side switch) 10 connected to a power terminal 102 to which a predetermined power supply voltage is supplied from an external power supply; and a switch MT1 connected to the semiconductor integrated circuit 10 and configured to prevent an electrical conduction to the semiconductor integrated circuit 10 when the external power supply is reverse-connected to the power terminal 102, wherein the semiconductor integrated circuit 10 is protected from a breakdown. In the embodiments, the semiconductor integrated circuit 10 is a high-side switch (10) including an N type semiconductor substrate (N-sub), and the external power supply is an onboard battery.

The high-side switch 10 is disposed between the onboard battery (power terminal 102) and a load (corresponding to reference numeral 100 shown in FIG. 3) which is connected to an output terminal 104. The high-side switch 10 is configured to output a power supply voltage (applied voltage) VBB from the onboard battery as an operating voltage through the output terminal (OUT) 104 in response to a supply of a high level signal (control signal) to an input terminal (IN) 106, for example.

A high-side switch 10 according to a comparative example is configured to protect a switch 10 from a failure or breakdown with respect to an over current by means of a clamp circuit for absorbing surge current (mentioned below) inserted between a power terminal 102 and a ground (GND) (earth) terminal as an Electro Static Discharge (ESD) protection, for example. In addition, the high-side switch 10 may include a functional block for protecting from a failure or breakdown when an output negative voltage is detected, etc.

The protection circuit 12 is a circuit which is configured so that the high-side switch 10 is not broken down also when the onboard battery is reverse-connected to the power terminal 102. Although the details will be mentioned below, the protection circuit 12 includes an N-channel MOSFET (Metal Oxide Semiconductor Field Effect Transistor) MT1 capable of functioning as a switch configured to interrupt a current path between the ground (earth) terminal and the power terminal 102 when the onboard battery is reverse-connected thereto, for example.

The onboard battery in a normal connection state supplies a power supply voltage VBB of approximately 12V to 14V from the power terminal 102.

More specifically, according to the onboard IC capable of mounting the protection circuit 12 according to the embodiments, even when the onboard battery is reverse-connected so that the power supply voltage VBB which should be applied to the power terminal 102 is accidentally applied to the ground (earth) terminal side, the high-side switch 10 is configured to interrupt the current path from the ground (earth) terminal side to the power terminal side, and thereby to prevent the protection circuit 12 from a breakdown.

On the other hand, according to the onboard IC according to the comparative example, as shown in FIG. 1B, a current-limiting resistor 20 and a voltage clamping diode 22 are connected in parallel to each other between the high-side switch 10 and the ground (earth) terminal, as a protection circuit for protecting the high-side switch 10 therefrom.

According to the onboard IC according to the comparative example, although the high-side switch 10 can be protected from a breakdown due to a reverse connection of the onboard battery, an applied-voltage range is relatively narrow and therefore it is unsuitable for a reduction of the applied voltage, since GND potential (earth potential) is increased in accordance with a circuit current which flows through an inside of the onboard IC and a resistance value (e.g., approximately 100Ω) of a resistance element 20.

According to the onboard IC capable of mounting the protection circuit 12 according to the embodiments, since the protection circuit 12 can reduce an on-resistance of the switch by adopting the MOSFET, the applied voltage can easily be reduced.

In addition, the onboard IC (in particular high-side switch 10) capable of mounting the protection circuit 12 according to the embodiments is formed through the so-called N-sub process into which a semiconductor substrate (N-sub) having N type conductivity is adopted.

Next, a specific configuration of the onboard IC will be explained for details.

FIG. 2 shows one configuration example of the protection circuit 12 according to the embodiments applicable to the onboard IC. As shown in FIG. 2, the protection circuit 12 includes: N-channel MOSFETs (MOS transistors) MT1, MT2, MT3, MT4; and a Zener diode ZD1 for clamping breakdown-voltage. In the protection circuit 12, the MOS transistors MT1, MT2, MT3 may compose an output Negative Voltage Protection (NVP) circuit 14.

The MOS transistors MT1, MT2 are used for high voltage (HV), and both are respectively composed by including enhancement mode N-channel MOSFETs (E-NMOS transistors). The MOS transistor MT3 is used for low voltage (LV), the MOS transistor MT4 is used for HV, and both are respectively composed by including depletion mode N-channel MOSFETs (D-NMOS transistors).

Moreover, a resistance element (resistor) may be substituted for the D-NMOS transistor MT4.

More specifically, the protection circuit 12 includes: a first D-NMOS transistor MT4 of which a drain (D) is connected to the power terminal 102; a second E-NMOS transistor (switch) MT1 of which a gate is connected to a gate (G) and a source (S) of the first D-NMOS transistor MT4, of which a drain is connected to the ground (earth) terminal, and of which a source is connected to a ground (earth) connection terminal GND_REF of the high-side switch 10; a third E-NMOS transistor MT2 of which a gate is connected to the gate and the source of the first D-NMOS transistor MT4, of which a drain is connected to the ground (earth) terminal, and of which a source is connected to a backgate (B) which is a body terminal of the second E-NMOS transistor MT1; a fourth D-NMOS transistor MT3 of which a gate and a source are connected to the backgate of the second E-NMOS transistor MT1, and of which a drain is connected to the source of the second E-NMOS transistor MT1; and a Zener diode ZD1 of which an anode is connected to the source of second E-NMOS transistor MT1, and of which a cathode is connected to the gate and the source of the first D-NMOS transistor MT4.

In other words, the switch MT1 is the second NMOS transistor MT1. The gate of the second NMOS transistor MT1 is connected to the gate and source of the first NMOS transistor MT4 of which the drain is connected to the power terminal 102. The drain of the second NMOS transistor MT1 is connected to the ground (earth) terminal. The source of the second NMOS transistor MT1 is connected to the semiconductor integrated circuit (high-side switch) 10. Moreover, the drain of the third NMOS transistor MT2 and the gate and source of the fourth NMOS transistor MT3 are connected to the backgate (B) of the second NMOS transistor MT1. The gate of the third NMOS transistor MT2 is connected to the gate and source of the first NMOS transistor MT4, and the source of the third NMOS transistor MT2 is connected to the ground (earth) terminal. The drain of the fourth NMOS transistor MT3 is connected to the source of the second NMOS transistor MT1.

Since the E-NMOS transistor MT1 herein is on/off operated in accordance with a state of the onboard battery, a gate voltage is pulled up to the power supply voltage VBB.

In the embodiments, if the onboard battery is normally connected (i.e., a normal state), the gate voltage of the E-NMOS transistor MT1 becomes equal to or more than a predetermined voltage (drain voltage+ Vth), and the E-NMOS transistor MT2 is turned on. Thus, a backgate of E-NMOS transistor MT1 has an equivalent potential to that of the drain, and the E-NMOS transistor MT1 is turned on (the source and the drains are short-circuited therebetween).

On the other hand, if the onboard battery is reverse-connected, the gate voltage of the E-NMOS transistor MT1 becomes equal to or less than the predetermined voltage, and the E-NMOS transistor MT2 is turned off. Then, by the D-NMOS transistor MT3, since the backgate of the E-NMOS transistor MT1 has an equivalent potential to that of the source, E-NMOS transistor MT1 is turned off.

More specifically, according to the protection circuit 12 according to the embodiments, since any one of the E-NMOS transistor MT2 or D-NMOS transistor MT3 each connected to the backgate of the E-NMOS transistor MT1 is selectively turned on in accordance with the status of connection of the onboard battery, in the NVP circuit 14, the D-NMOS transistor MT3 is selectively turned on and the E-NMOS transistor MT1 is turned off, if the onboard battery is reverse-connected. Thus, the current path from the ground (earth) terminal (drain) side to the power terminal (source) 102 side is interrupted, and thereby the electrical conduction to the high-side switch 10 is prevented.

Figure 3:
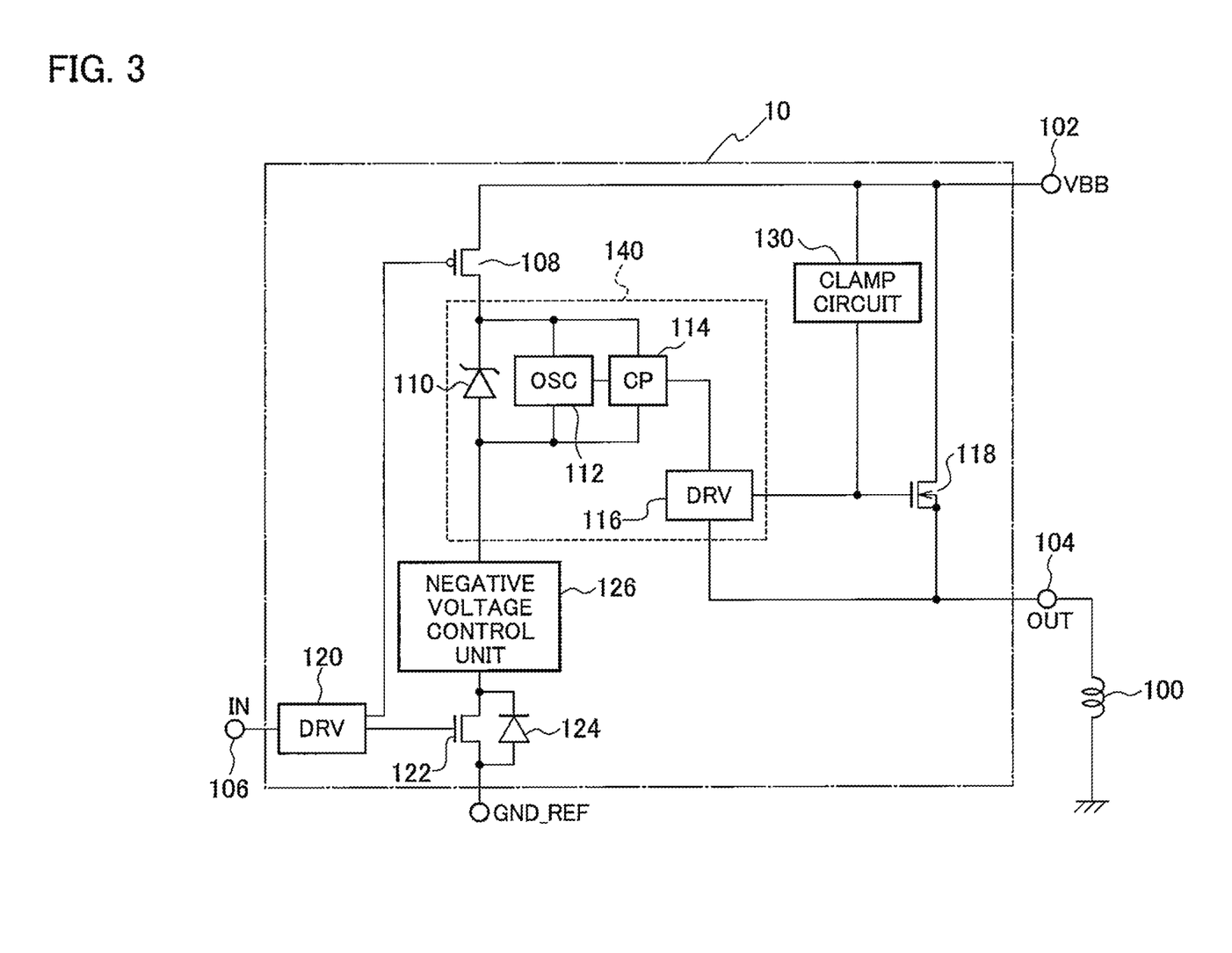
FIG. 3 is a circuit configuration diagram showing a concrete example of a high-side switch shown in FIGS. 1 and 2.

FIG. 3 shows one configuration example of the high-side switch 10. As shown in FIG. 3, the high-side switch 10 includes: a PMOS transistor (first PMOS transistor) 108; a Zener diode 110; an oscillator (OSC) 112; a charge pump (CP) 114; a gate drive circuits (DRV) 116, 120; an NMOS transistors (fifth and sixth NMOS transistors) 118, 122; an negative voltage control unit 126; and a clamp circuit (Electro Static Discharge (ESD) protection apparatus) 130.

In the high-side switch 10, a drive control unit 140 of the NMOS transistor 118 may be composed by including the Zener diode 110, the OSC (oscillation circuit) 112, the CP (booster circuit) 114, and a DRV 116. In addition, the high-side switch 10 may includes a power terminal (VBB) 102, an output terminal (OUT) 104, and an input terminal (IN) 106.

The fifth NMOS transistor 118 is connected between the power terminal 102 and the output terminals 104 to which a load to which an operating voltage is to be supplied is connected. The drive control unit 140 is connected to a gate of the fifth NMOS transistor 118. The sixth NMOS transistor 122 is disposed between the drive control unit 140 and the input terminal 106 into which a control signal is input, and a source thereof is connected to the protection circuit (switch) 12 through the ground (earth) connection terminal GND_REF. The negative voltage control unit 126 is disposed between the sixth NMOS transistor 122 and the drive control unit 140. The first PMOS transistor 108 is disposed between the drive control unit 140 and the power terminal 102, and a control signal is input into a gate of the first PMOS transistor. The clamp circuit 130 is disposed between the power terminal 102 and the gate of the fifth NMOS transistor 118.

The predetermined power supply voltage VBB (e.g., approximately 14V) is supplied to the power terminal 102 as an applied voltage from an onboard battery (not shown), in the normal state. A source of the PMOS transistor 108 and a drain of the NMOS transistor 118 are connected to the power terminal 102.

A high-level control signal to be used for setting the high-side switch 10 as an enabled state is supplied to the input terminal 106 from an external control circuit (not shown) as an input, for example. In the case of an onboard IC, the external control circuit may be composed by including an Engine Control Unit (ECU) etc., for example.

The DRV 120 is connected to a gate of the PMOS transistor 108 and a gate of the NMOS transistor 122. The source of the NMOS transistor 122 is connected to the protection circuit 12 through the ground (earth) connection terminal GND_REF, and a drain thereof is connected to the negative voltage control unit 126. The NMOS transistor 122 includes a body diode 124 between the source and the drain.

The protection circuit 12 is connected to the ground (earth) connection terminal GND_REF, and thereby the ground (earth) of the high-side switch 10 becomes a ground (earth) of the protection circuit 12.

When a signal of the input terminal 106 is at high level, the DRV 120 supplies a high-level output voltage to the gate of the NMOS transistor 122, and supplies a low-level output voltage to the gate of the PMOS transistor 108.

On the other hand, when the signal of the input terminal 106 is at low level, the DRV 120 supplies the low-level output voltage to the gate of the NMOS transistor 122, and supplies the high-level output voltage to the gate of the PMOS transistor 108.

When the signal of the input terminal 106 is at high level, the gate of the PMOS transistor 108 becomes the low level, the PMOS transistor 108 is turned on, the gate of the NMOS transistor 122 becomes the high level, and the NMOS transistor 122 is also turned on.

When the signal of the input terminal 106 is at low level, the gate of the PMOS transistor 108 becomes the high level, the PMOS transistor 108 is turned off, the gate of the NMOS transistor 122 becomes the low level, and the NMOS transistor 122 is also turned off.

More specifically, when the signal of the input terminal 106 to the DRV 120 is the high level, the PMOS transistor 108 is turned on and the NMOS transistor 122 is also turned on.

On the other hand, when the signal of the input terminal 106 to the DRV 120 is the low level, the PMOS transistor 108 is turned off and the NMOS transistor 122 is also turned off.

The negative voltage control unit 126 may be a functional block for protecting the high-side switch 10 from a breakdown when detecting an output negative voltage, and it may have the same configuration as the NVP circuit 14 in the protection circuit 12 composed by including the MOS transistors MT1, MT2, MT3, for example.

Between the negative voltage control unit 126 and the drain of the PMOS transistor 108, the Zener diode 110, the OSC 112 and the CP 114 composing the drive control unit 140 are connected to one another in parallel. Moreover, the DRV 116 of the drive control unit 140 is connected to the CP 114, and the gate and source of the NMOS transistor 118 and the output terminal 104 are connected to the DRV 116. More specifically, the DRV (drive circuit) 116 is connected between the CP (booster circuit) 114, and the gate of the fifth NMOS transistor 118 and the output terminal 104. The DRV 116 outputs the input as it is without reversing the input. Thus, the drive control unit 140 turns on the NMOS transistor 118 by, for example, supplying to the DRV 116 a voltage boosted by the CP 114 on the basis of an oscillation output from the OSC 112. A degree of the oscillation output from the OSC 112 or boosting by the CP 114 may be determined by the Zener diode 110.

Moreover, the clamp circuit 130 is connected between the gate of the NMOS transistor 118 and the power terminal 102. The clamp circuit 130 is an ESD protection apparatus for absorbing surge current. Moreover, the clamp circuit 130 is configured to prevent from significantly reducing of the operating voltage (e.g., approximately −30V) supplied from the output terminal 104 by temporarily clamping the gate voltage when driving the NMOS transistor 118.

A load 100 is connected to the output terminal 104. In the case of the onboard IC, there are assumed electronic components, e.g. various in-vehicle accessories, operated by supplying the operating voltage according to the power supply voltage VBB, as the load 100.

According to the high-side switch 10 shown in FIG. 3, the high-side switch 10 can be protected from a breakdown by providing the negative voltage control unit 126, also when an output negative voltage is detected, in addition to a reverse connection state of the onboard battery.

[Operational Method of Protection Circuit]

Figure 4A:
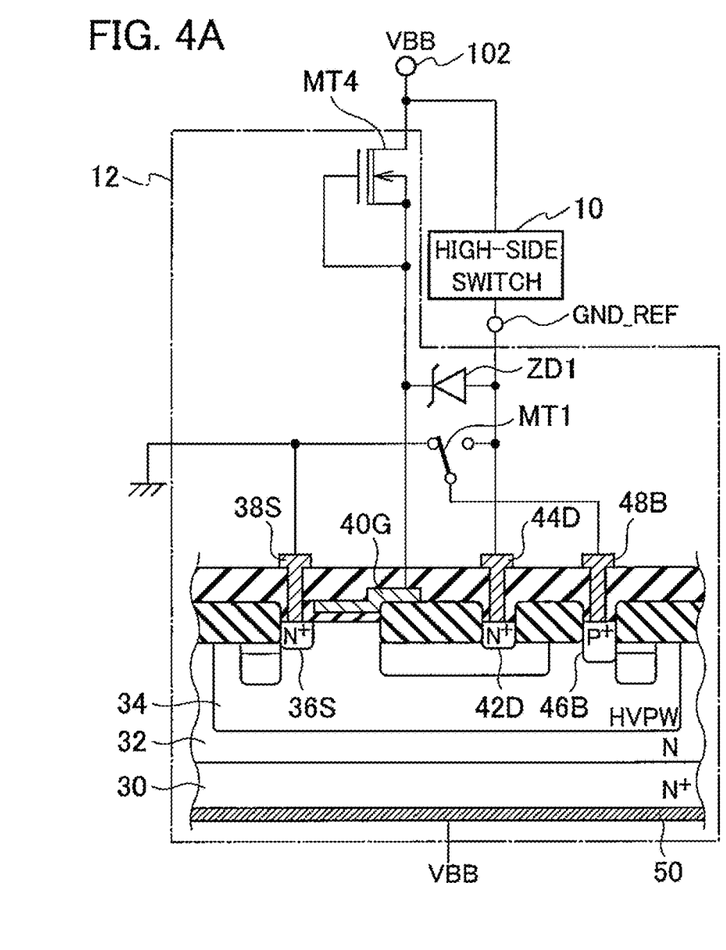
FIG. 4A is a schematic configuration diagram showing a normal connection state of a battery, illustrating a part of a device structure in the protection circuit according to the embodiments and explaining an operation thereof.
Figure 4B:
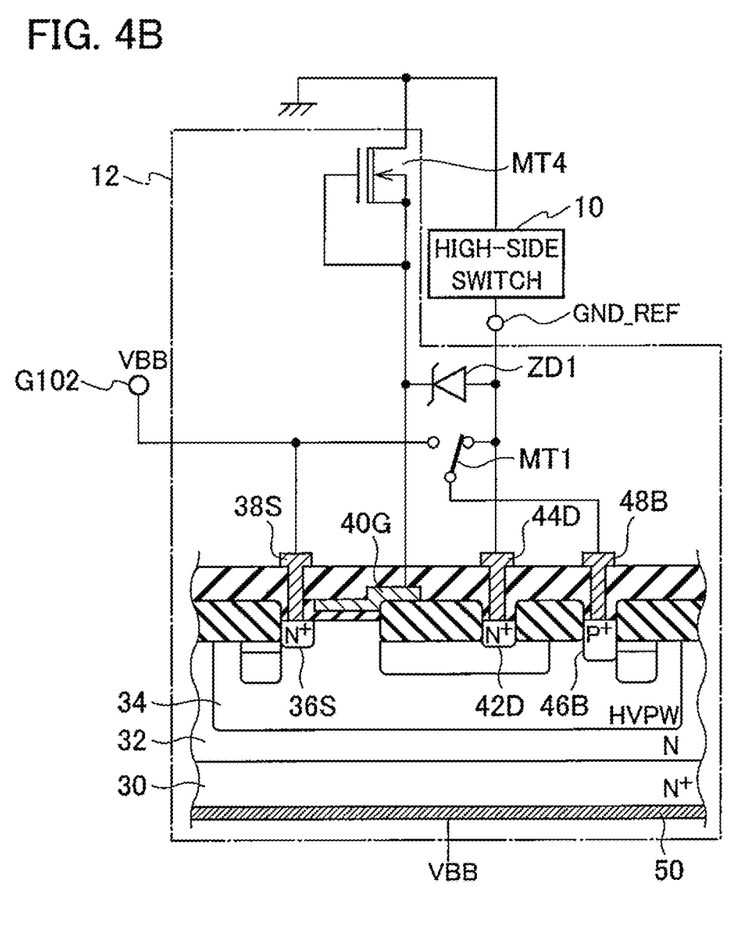
FIG. 4B is a schematic configuration diagram showing a reverse connection state of the battery, illustrating the part of the device structure in the protection circuit according to the embodiments and explaining an operation thereof.

FIG. 4 shows schematically a part of device structure in the protection circuit 12 according to the embodiments, for explaining an operation of the protection circuit 12. FIG. 4A corresponds to a normal connection state of the onboard battery, and FIG. 4B corresponds to a reverse connection state of the onboard battery. However, only a cross-sectional structure of the E-NMOS transistor MT2 is illustrated in FIGS. 4A and 4B for convenience.

The operation of the protection circuit 12 according to the embodiments is an operation of protecting from a breakdown the semiconductor integrated circuit 10 connected to the power terminal 102 to which a predetermined power supply voltage is supplied from an external power supply, so that a current path between the ground (earth) terminal and the power terminal 102 is interrupted by means of a switch MT1 when the external power supply is reverse-connected to the power terminal 102. The switch MT1 corresponds to the MOS transistor (MT1), and the MOS transistor (MT1) is turned off when the external power supply is reverse-connected to the power terminal 102, and thereby an electrical conduction to the semiconductor integrated circuit 10 can be prevented.

The switch MT1 may be an enhancement mode second NMOS transistor. In this case, the gate of the enhancement mode second NMOS transistor is connected to the gate and source of the depletion mode first NMOS transistor MT4 of which the drain is connected to the power terminal 102, the drain of the second NMOS transistor is connected to the ground (earth) terminal, and the source of the second NMOS transistor is connected to the semiconductor integrated circuit 10. In this case, the drain of the enhancement mode third NMOS transistor MT2 and the gate and source of the depletion mode fourth NMOS transistor MT3 are connected to the backgate of the second NMOS transistor MT1. Moreover, the gate of the enhancement mode third NMOS transistor MT2 is connected to the gate and source of the first NMOS transistor MT4, and the source of the third NMOS transistor is connected to the ground (earth) terminal. Moreover, the drain of the depletion mode fourth NMOS transistor MT3 is connected to the source of the second NMOS transistor MT1. Furthermore, with regard to the NMOS transistor MT2 and the NMOS transistor MT3 to be connected to the backgate of the second NMOS transistor MT1, it is switched from the third NMOS transistor MT2 to the fourth NMOS transistor MT3 when the external power supply is reverse-connected to the power terminal 102.

The protection circuit 12 according to the embodiments includes: an $N^+$ type semiconductor substrate 30, an N type semiconductor layer 32 formed on the $N^+$ type semiconductor substrate 30, and a high-voltage P type well region (HVPW) 34 formed on the N type semiconductor layer 32. On the P type well region 34, a gate electrode 40G is formed via a gate oxide film. The gate electrode 40G is connected to the gate and the source of the D-NMOS transistor MT4.

$N^+$ type diffusion regions 36S, 42D and a $P^+$ type diffusion region 46B are formed on a surface of the P type well region 34. The $N^+$ type diffusion region 36S is connected to the ground (earth) terminal and the drain of the E-NMOS transistor MT1 through the source electrode 38S. The $N^+$ type diffusion region 42D is connected to the source of the E-NMOS transistor MT1 through the drain electrode 44D and the D-NMOS transistor MT3 (not shown). The $P^+$ type diffusion region 46B is connected to the backgate of the E-NMOS transistor MT1 through a backgate electrode 48B.

Moreover, a back surface electrode 50 to which the power supply voltage VBB is supplied is formed on a surface opposite to the gate electrode 40G (i.e., back side surface) of the $N^+$ type semiconductor substrate 30.

The protection circuit 12 having such a configuration can be formed on an N type semiconductor substrate (N-sub) on which the high-side switch 10 is formed. More specifically, the first NMOS transistor MT4, the second NMOS transistor MT1, the third NMOS transistor MT2, and the fourth NMOS transistor MT3 can be formed on the N type semiconductor substrate (N-sub).

As shown in FIG. 4A, at the normal connection state, in response to turning-on of the E-NMOS transistor MT2, the $N^+$ type diffusion region 36S and the $P^+$ type diffusion region 46B are connected to the ground (earth) terminal through the backgate of the E-NMOS transistor MT1. Thus, the E-NMOS transistor MT1 is turned on and the connection between the source and the drain is short-circuited, and thereby it is possible to perform the electrical conduction to the high-side switch 10 by the E-NMOS transistor MT1.

On the other hand, when the onboard battery is reverse-connected to a terminal G102 which should fundamentally be the ground (earth) terminal, as shown in FIG. 4B, the power supply voltage VBB is applied to the $N^+$ type diffusion region 36S, the E-NMOS transistor MT2 is turned off, and accordingly the backgate of the E-NMOS transistor MT1 is connected to the source through the D-NMOS transistor MT3. Thereby, the current path for electrical conduction to the high-side switch 10 is interrupted by turning off the E-NMOS transistor MT1.

Thus, according to the protection circuit 12 according to the embodiments, even if the onboard battery is reverse-connected, the high-side switch 10 can be prevented from a breakdown.

More specifically, the E-NMOS transistor MT2 connected to backgate of the E-NMOS transistor MT1 at the normal connection state is switched to the D-NMOS transistor MT3 at the reverse connection state of the battery. Thus, when the onboard battery is reverse-connected thereto, the E-NMOS transistor MT1 is turned off and thereby the current path from the ground (earth) terminal side to the power terminal 102 side can be interrupted. Consequently, even when the predetermined power supply voltage VBB is applied from the onboard battery to the terminal G102, the high-side switch 10 can be prevented from a breakdown.

In addition, since the E-NMOS transistor MT1 can be turned on and turned off in accordance with the selection of the backgate (selection between the NMOS transistors MT2 and MT3), an on-resistance of the switch can be reduced. In particular, since it is possible to reduce the on-resistance in the case of the high-side switch 10 formed on the N type semiconductor substrate by the N-sub process rather than a case where a resistance element etc. are used, a setting range of the applied-voltage range can be extended. Accordingly, the applied voltage can easily be reduced, and thereby microcomputer of which the operating voltage is 5V is switched to a microcomputer of which the operating voltage is 3.3V, for example.

Moreover, the protection circuit according to the embodiments can be used for not only the onboard ICs but also whole ICs to which external power supplies are connected, and is widely applicable to various fields which use various storage batteries which are represented in particular by lithium ion batteries, as the external power supplies.

As explained above, according to the embodiments, there can be provided: the protection circuit capable of protecting the semiconductor integrated circuit from the breakdown due to reverse connection of external power supply and realizing the voltage reduction of the applied voltage; and the operational method of such a protection circuit.

[ESD Protection Apparatus]

Figure 5:
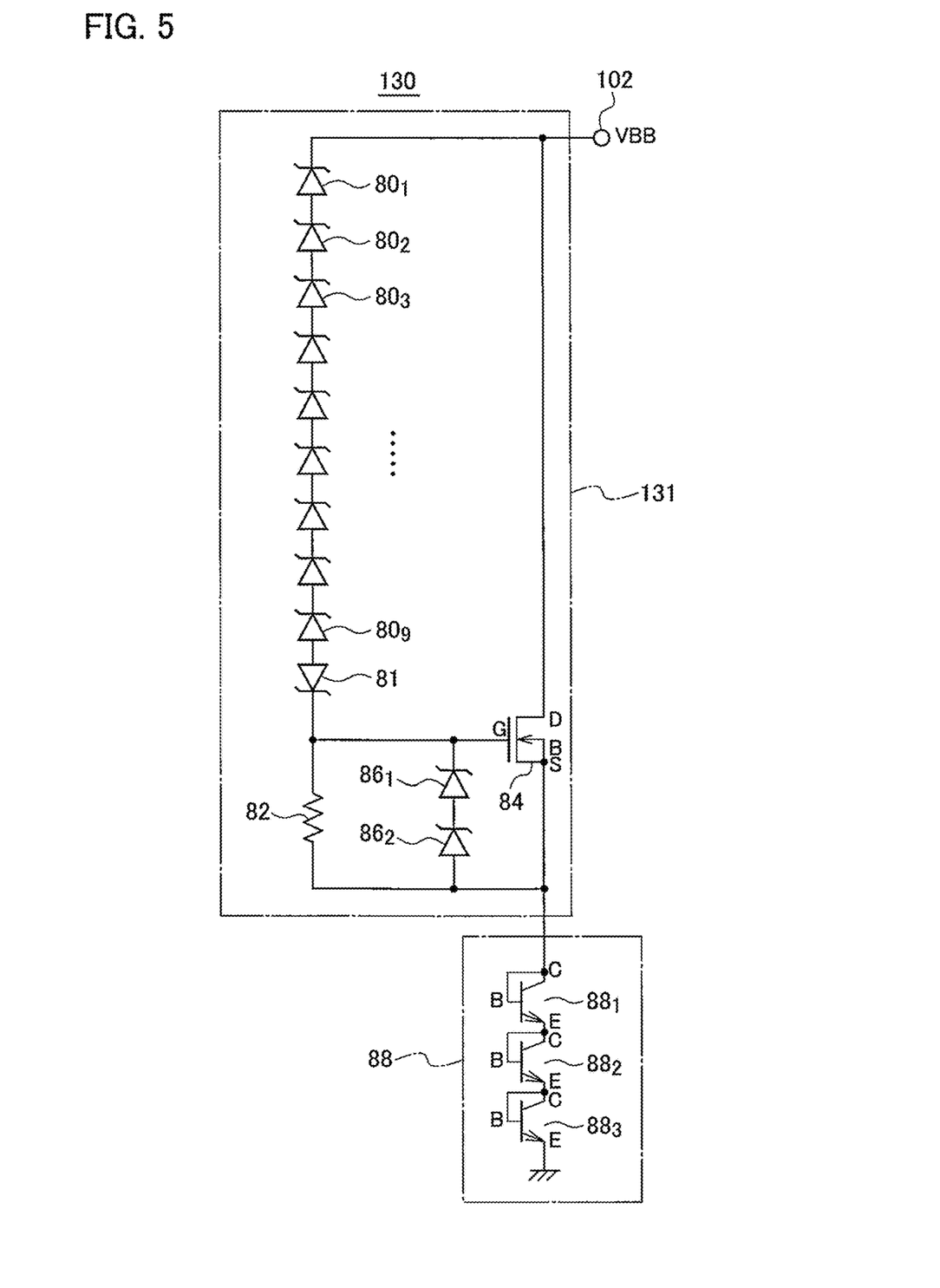
FIG. 5 is a schematic structure diagram showing a concrete example of an Electro Static Discharge (ESD) protection apparatus according to the embodiments.

Next, a configuration of the ESD protection apparatus 130 according to the embodiments will now be explained. FIG. 5 shows a specific circuit configuration of the ESD protection apparatus 130.

More specifically, the ESD protection apparatus 130 according to the embodiments is inserted between the power terminal 102 and the ground (earth) terminal, for example, and includes: an ESD clamp circuit unit 131 fundamentally as a clamp circuit configured to protect the high-side switch 10 from an electro-static discharge breakdown; and a protection circuit unit 88 configured to protect the ESD clamp circuit unit 131 from a breakdown when the onboard battery is reverse-connected thereto.

In the embodiments, the protection circuit unit 88 may be the protection circuit 12 illustrated in FIGS. 1A, 2, 4, etc. In this case, the protection circuit 12 is connected to the ESD clamp circuit unit 131 inserted between the power terminal 102 and the ground (earth) terminal, for example, and is configured (as a protection circuit unit 88) to protect the ESD clamp circuit unit 131 from a breakdown when an external power supply is reverse-connected to the power terminal 102.

The ESD protection apparatus 130 according to the embodiments includes: a semiconductor integrated circuit (high-side switch) 10 (refer to FIGS. 1A, 3, and 4) connected between the power terminal 102 to which a predetermined power supply voltage is supplied from an external power supply and the ground (earth) terminal; a clamp circuit unit 131 inserted between the power terminal 102 and the ground (earth) terminal; and a protection circuit unit 88 connected to the clamp circuit unit 131 and configured to protect the clamp circuit unit 131 from a breakdown when the external power supply is reverse-connected to the power terminal 102, wherein the semiconductor integrated circuit 10 is protected from an electro-static discharge breakdown.

In the embodiments, the external power supply is an onboard battery. The semiconductor integrated circuit 10 is a high-side switch (10) including an N type semiconductor substrate (N-sub).

Moreover, the ESD clamp circuit unit 131 is provided in the high-side switch 10. The ESD clamp circuit unit 131 is configured to absorb a surge current.

In the embodiments, the ESD clamp circuit unit 131 is composed by including: an NMOS transistor 84; first to ninth Zener diodes $80_1, 80_2, 80_3, \ldots, 80_9$ and a tenth Zener diode 81 which are connected in series; a resistance element 82; and eleventh and twelfth Zener diodes $86_1, 86_2$ connected in series. More specifically, the ESD clamp circuit unit 131 includes: an NMOS transistor 84 of which a drain is connected to the power terminal 102; a first Zener diode $80_1$ of which a cathode is connected to the drain of the NMOS transistor 84; a second Zener diode $80_2$ of which a cathode is connected to an anode of the first Zener diode $80_1$; a third Zener diode $80_3$ of which a cathode is connected to an anode of the second Zener diode $80_2$; a fourth Zener diode $80_4$ of which a cathode is connected to an anode of the third Zener diode $80_3$; a fifth Zener diode $80_5$ of which a cathode is connected to an anode of the fourth Zener diode $80_4$; a sixth Zener diode $80_6$ of which a cathode is connected to an anode of the fifth Zener diode $80_5$; a seventh Zener diode $80_7$ of which a cathode is connected to an anode of the sixth Zener diode $80_6$; an eighth Zener diode $80_8$ of which a cathode is connected to an anode of the seventh Zener diode $80_7$; a ninth Zener diode $80_9$ of which a cathode is connected to an anode of the eighth Zener diode $80_8$; a tenth Zener diode 81 of which an anode is connected to an anode of the ninth Zener diode $80_9$, and of which a cathode is connected to a gate of the NMOS transistor 84; a resistance element 82 connected between the gate and a source of the NMOS transistor 84; an eleventh Zener diode $80_{11}$ of which a cathode is connected to the gate of the NMOS transistor 84; and a twelfth Zener diode $80_{12}$ of which a cathode is connected to an anode of the eleventh Zener diode $80_{11}$.

In the ESD clamp circuit unit 131, the first to ninth Zener diodes $80_1$, $80_2$, $80_3$, . . . , $80_9$ are connected to one another in the same direction. The tenth Zener diode 81 is connected thereto in a direction different from the first to ninth Zener diodes $80_1$, $80_2$, $80_3$, . . . , $80_9$. Moreover, the anode of the ninth Zener diode $80_9$ and the anode of the tenth Zener diode 81 are connected to each other, the power terminal 102 is connected to the cathode of the first Zener diode $80_1$, and the gate (G) of the NMOS transistor 84 is connected to the cathode of the tenth Zener diode 81.

The power terminal 102 is connected to the drain (D) of the NMOS transistor 84, and the protection circuit unit 88 is connected to the source (S) of the NMOS transistor 84 in series. Moreover, the resistance element 82 and the eleventh and twelfth Zener diodes $86_1$, $86_2$ are connected between the gate and the source of the NMOS transistor 84. The eleventh and twelfth Zener diodes $86_1$, $86_2$ are connected to each other in the same direction, and the cathode of the eleventh Zener diode $86_1$ is connected to the gate of the NMOS transistor 84, and the anode of the twelfth Zener diode $86_2$ is connected to the source of the NMOS transistor 84.

The protection circuit unit 88 is configured so that a plurality of (e.g., three pieces of) Zener diodes 881, 882, 883 are connected to one another in series. The Zener diodes 881, 882, 883 may be composed by including bipolar junction transistors (npn transistors) each of which between a base (B) and a collector (C) is connected to each other, for example. More specifically, the protection circuit unit 88 may be composed by including a serial stage of a plurality of bipolar junction transistors each of which between the base and the collector is short-circuited.

The protection circuit unit 88 is set so that a reverse breakdown voltage by the Zener diodes $88_1$, $88_2$, $88_3$ becomes equal to or more than the power supply voltage VBB (e.g., approximately 24V) of the onboard battery (external power supply), and thereby a breakdown of the NMOS transistor 84 can be avoided when the onboard battery is reverse-connected. More specifically, the protection circuit unit 88 in which the Zener diodes $88_1$, $88_2$, $88_3$ are connected in series so that the reverse breakdown voltage becomes equal to or more than the battery voltage (VBB) is connected to the ESD clamp circuit unit 131 in series, and thereby a body diode (not shown) of the NMOS transistor 84 which exists towards the power terminal 102 side from the ground (earth) terminal side can be protected from a breakdown due to a reverse connection of the onboard battery. Moreover, the protection circuit unit 88 can be formed on the N type semiconductor substrate (N-sub).

Similarly, the Zener diodes $80_1$, $80_2$, $80_3$, . . . , $80_9$, 81, $86_1$, $86_2$ composed by including npn transistors can also be protected from a breakdown due to a reverse connection of the onboard battery.

Thus, by such a relatively simple configuration to which the protection circuit unit 88 is added to the already-existing clamp circuit, the ESD protection apparatus 130 can protect the high-side switch 10 from an electro-static discharge breakdown, and further can protect the high-side switch 10 also from a breakdown due to the reverse connection of the onboard battery.

Figure 6A:
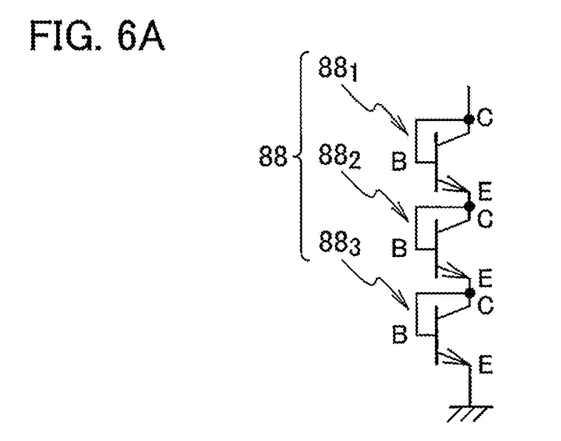
FIG. 6A is a circuit configuration diagram, showing a concrete example of the protection circuit unit in the ESD protection apparatus according to the embodiments.
Figure 6B:
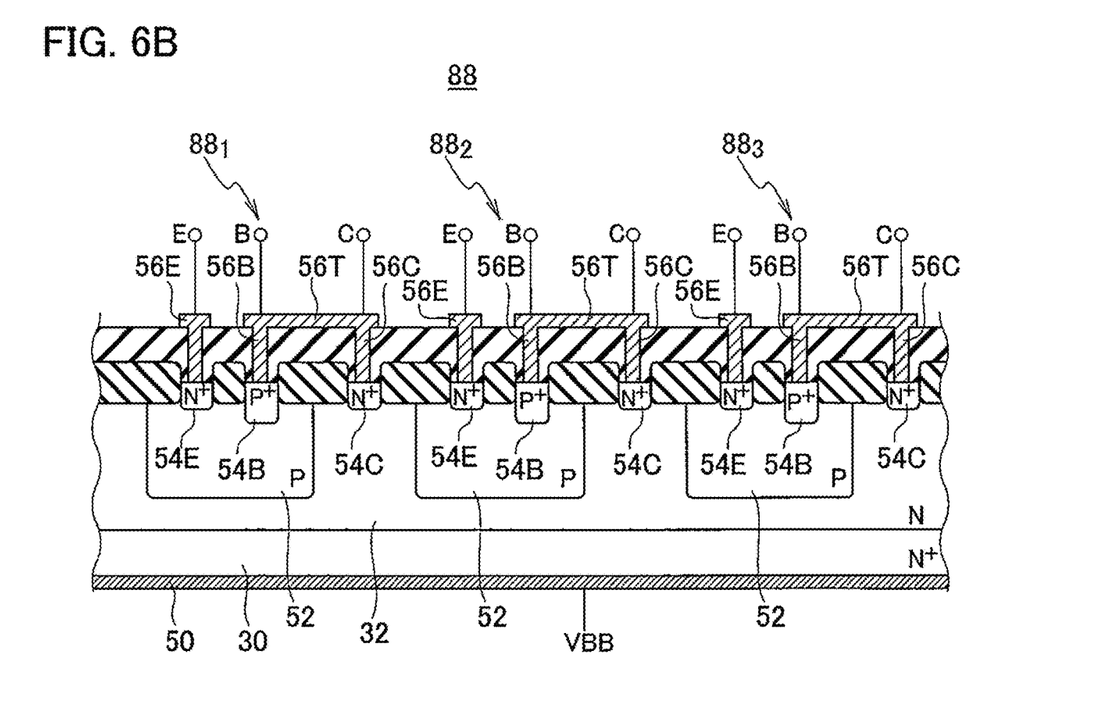
FIG. 6B is a schematic cross-sectional structure diagram, showing the concrete example of the protection circuit unit in the ESD protection apparatus according to the embodiments.

FIG. 6A shows a circuit configuration of the protection circuit unit 88, and FIG. 6B shows a schematic cross-sectional structure of the protection circuit unit 88.

In the protection circuit unit 88, as shown in FIG. 4, the Zener diodes $88_1$, $88_2$, $88_3$ may be formed, with the ESD clamp circuit unit 131, for example, on the N$^+$ type semiconductor substrate 30 on which the protection circuit 12 is formed.

More specifically, each of the Zener diodes $88_1$, $88_2$, $88_3$ in the protection circuit unit 88 is formed by including: a N type semiconductor layer 32 formed on the N$^+$ type semiconductor substrate 30; a P type well region 52 formed on a surface portion of the N type semiconductor layer 32; an N$^+$ type diffusion region 54E and a P$^+$ type diffusion region 54B which are formed on a surface portion of the P type well region 52; and an N$^+$ type diffusion region 54C formed on a surface portion of the N type semiconductor layer 32.

The N$^+$ type diffusion regions 54C are respectively extracted through collector electrodes 56C and respectively become collectors of the Zener diodes $88_1$, $88_2$, $88_3$. The N$^+$ type diffusion regions 54E are respectively extracted through emitter electrodes 56E and respectively become emitters of the Zener diodes $88_1$, $88_2$, $88_3$. The P$^+$ type diffusion regions 54B are respectively extracted through base electrodes 56B and respectively become bases of the Zener diodes $88_1$, $88_2$, $88_3$. In each Zener diode $88_1$, $88_2$, $88_3$, the base electrode 56B and the collector electrode 56C are connected to each other through a connection electrode 56T.

Moreover, the base and the collector of the Zener diode $88_1$ are connected to the ESD clamp circuit unit 131, the emitter of the Zener diode $88_1$ is connected to the base and the collector of the Zener diode $88_2$, the emitter of the Zener diode $88_2$ is connected to the base and the collector of the Zener diode $88_3$, the emitter of the Zener diode $88_3$ is connected to the ground (earth) terminal, for example, and thereby the protection circuit unit 88 which can be mounted on the N$^+$ type semiconductor substrate 30 is configured.

Figure 7A:
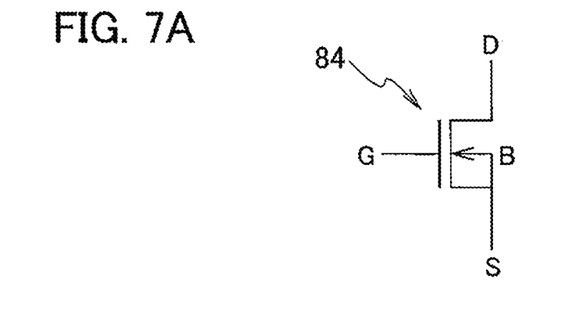
FIG. 7A is a circuit configuration diagram, showing a concrete example of an NMOS transistor included in a clamp circuit unit in the ESD protection apparatus according to the embodiments.
Figure 7B:
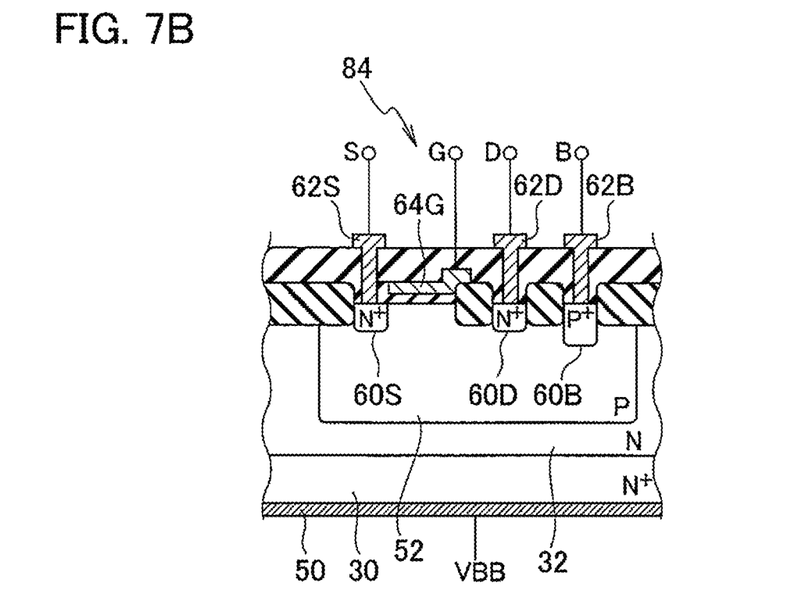
FIG. 7B is a schematic cross-sectional structure diagram, showing the concrete example of the NMOS transistor included in the clamp circuit unit in the ESD protection apparatus according to the embodiments.

On the other hand, in the ESD clamp circuit unit 131 to which the protection circuit unit 88 is connected, a circuit configuration of the NMOS transistor 84 is expressed as shown in FIG. 7A, and a schematic cross-sectional structure of NMOS transistor 84 is expressed as shown in FIG. 7B.

The NMOS transistor 84 may be formed, as a part of the ESD clamp circuit unit 131, for example, on the N$^+$ type semiconductor substrate 30 on which the protection circuit 12 is formed, as shown in FIG. 5.

More specifically, the NMOS transistor 84 includes: an N type semiconductor layer 32 formed on the N$^+$ type semiconductor substrate 30; a P type well region 52 formed on a surface portion of the N type semiconductor layer 32; an N$^+$ type diffusion regions 60S, 60D and a P$^+$ type diffusion region 60B which are formed on a surface portion of the P type well region 52; and a gate electrode 64G formed on the P type well region 52 via a gate oxide film.

The gate electrode 64G is connected to the source of the NMOS transistor 84, the cathode of the tenth Zener diode 81, etc. The N$^+$ type diffusion region 60S is connected to the protection circuit unit 88 through the source electrode 62S. The N$^+$ type diffusion region 60D is connected to the power terminal 102 through the drain electrode 62D. The P$^+$ type diffusion region 60B is connected to the source electrode 62S through the backgate electrode 62B.

Thus, according to the onboard IC including the ESD protection apparatus 130 according to the embodiments, even if the onboard battery is reverse-connected, the high-side switch 10 can be prevented from a breakdown.

More specifically, in the ESD protection apparatus 130, the protection circuit unit 88 set so that the reverse breakdown voltage becomes equal to or more than the power supply voltage VBB of the onboard battery is configured to be connected to the ESD clamp circuit unit 131 in series. Thus, the high-side switch 10 can be protected from a breakdown due to the electro static discharge, and the NMOS transistor 84 which is the ESD protection element for the electro static discharge protection can also be protected from a breakdown when the onboard battery is reverse-connected thereto.

In addition, the protection circuit unit composing apart of the ESD protection apparatus according to the embodiments can be applied to various ICs which require the ESD protection between the power terminal and the ground (earth) terminal. Moreover, the protection circuit unit of the embodiments can be used in particular for not only the onboard ICs but also whole ICs to which external power supplies are connected, and is widely applicable to various fields which use various storage batteries which are represented in particular by lithium ion batteries, as the external power supplies.

[Semiconductor Integrated Circuit Apparatus]

A semiconductor integrated circuit apparatus (not shown) according to the embodiments includes: a semiconductor integrated circuit (high-side switch) 10 (refer to FIGS. 1A, 3, and 4) connected between the power terminal 102 to which a predetermined power supply voltage is supplied from an external power supply and the ground (earth) terminal; and an ESD protection apparatus 130 (refer to FIGS. 5 to 6) configured to protect the semiconductor integrated circuit 10 from an electro-static discharge breakdown. The ESD protection apparatus 130 includes: an ESD clamp circuit unit 131 inserted between the power terminal 102 and the ground (earth) terminal; and a protection circuit unit 88 connected to the ESD clamp circuit unit 131 and configured to protect the ESD clamp circuit unit 131 from a breakdown when the external power supply is reverse-connected to the power terminal 102.

In the embodiments, the protection circuit unit 88 may be the protection circuit 12 illustrated in FIGS. 1A, 2, 4, etc. In this case, the semiconductor integrated circuit apparatus (not shown) according to the embodiments includes a protection circuit 12 configured to protect a semiconductor integrated circuit connected between the power terminal 102 to which a predetermined power supply voltage is supplied from an external power supply and the ground (earth) terminal, from an electro-static discharge breakdown. The protection circuit 12 is connected to the ESD clamp circuit unit 131 inserted between the power terminal 102 and the ground (earth) terminal, and is configured to protect the ESD clamp circuit unit (131) from a breakdown when the external power supply is reverse-connected to the power terminal 102.

In the embodiments, the external power supply is an onboard battery. The semiconductor integrated circuit 10 is a high-side switch (10) including an N type semiconductor substrate (N-sub).

Moreover, the ESD clamp circuit unit 131 is provided in the high-side switch 10. The ESD clamp circuit unit 131 is configured to absorb a surge current.

Moreover, the ESD clamp circuit unit 131 includes: an NMOS transistor 84 of which a drain is connected to the power terminal 102; a first Zener diode $80_1$ of which a cathode is connected to the drain of the NMOS transistor 84; a second Zener diode $80_2$ of which a cathode is connected to an anode of the first Zener diode $80_1$; a third Zener diode $80_3$ of which a cathode is connected to an anode of the second Zener diode $80_2$; a fourth Zener diode $80_4$ of which a cathode is connected to an anode of the third Zener diode $80_3$; a fifth Zener diode $80_5$ of which a cathode is connected to an anode of the fourth Zener diode $80_4$; a sixth Zener diode $80_6$ of which a cathode is connected to an anode of the fifth Zener diode $80_5$; a seventh Zener diode $80_7$ of which a cathode is connected to an anode of the sixth Zener diode $80_6$; an eighth Zener diode $80_8$ of which a cathode is connected to an anode of the seventh Zener diode $80_7$; a ninth Zener diode $80_9$ of which a cathode is connected to an anode of the eighth Zener diode $80_8$; a tenth Zener diode 81 of which an anode is connected to an anode of the ninth Zener diode $80_9$, and of which a cathode is connected to a gate of the NMOS transistor 84; a resistance element 82 connected between the gate and a source of the NMOS transistor 84; an eleventh Zener diode $80_{11}$ of which a cathode is connected to the gate of the NMOS transistor 84; and a twelfth Zener diode $80_{12}$ of which a cathode is connected to an anode of the eleventh Zener diode $80_{11}$.

In the embodiments, the protection circuit unit 88 is connected to the source (S) of the NMOS transistor 84 in series. Moreover, the protection circuit unit 88 is configured so that a plurality of (e.g., three pieces of) Zener diodes $88_1$, $88_2$, $88_3$ are connected to one another in series. Moreover, the protection circuit unit 88 is set so that a reverse breakdown voltage by a plurality of the Zener diodes $88_1$, $88_2$, $88_3$ becomes equal to or more than the power supply voltage VIBE (e.g., approximately 24V) of the onboard battery (external power supply).

Moreover, in the protection circuit unit 88, the plurality of the Zener diodes $88_1$, $88_2$, $88_3$ are composed by including a serial stage of a plurality of bipolar junction transistors each of which between the base and the collector is short-circuited.

Moreover, the protection circuit unit 88 can be formed on the N type semiconductor substrate (N-sub).

According to the embodiments, there can be provided: the ESD protection apparatus capable of protecting the semiconductor integrated circuit from the electro-static discharge breakdown, and protecting the semiconductor integrated circuit also from the breakdown due to reverse connection of external power supply;

and the semiconductor integrated circuit apparatus including such an ESD protection apparatus.

Other Embodiments

As explained above, some embodiments have been described, as a disclosure including associated description and drawings to be construed as illustrative, not restrictive. This disclosure makes clear a variety of alternative embodiments, working examples, and operational techniques for those skilled in the art. Such being the case, the embodiments described herein cover a variety of embodiments, whether described or not.

INDUSTRIAL APPLICABILITY

The protection circuit according to the embodiments can be applied to onboard ICs. Such a protection circuit can be used also for ICs etc. other than the onboard ICs, and can be applied in particular to various semiconductor integrated circuits which have a possibility that external power supplies are reverse-connected.

The ESD protection apparatus according to the embodiments can be applied to the onboard ICs. Such an ESD protection apparatus can be used also for ICs etc. other than the onboard ICs, and can be applied in particular to various semiconductor integrated circuits which have a possibility that external power supplies are reverse-connected.

What is claimed is:

1. A protection circuit comprising:
a semiconductor integrated circuit connected to a power terminal, a predetermined power supply voltage being supplied to the power terminal from an external power supply; and
a switch connected to the semiconductor integrated circuit, the switch configured to prevent an electrical conduction to the semiconductor integrated circuit when the external power supply is reverse-connected to the power terminal, wherein
the semiconductor integrated circuit is protected from a breakdown, wherein
the switch comprises an MOS transistor configured to interrupt a current path from a ground terminal side to a power terminal side, wherein
the switch is a second NMOS transistor, a gate of the second NMOS transistor is connected to a gate and a source of a first NMOS transistor of which a drain is connected to the power terminal, a drain of the second NMOS transistor is connected to a ground terminal, and a source of the second NMOS transistor is connected to the semiconductor integrated circuit, wherein
a drain of a third NMOS transistor and a gate and a source of a fourth NMOS transistor are connected to a back-gate of the second NMOS transistor, a gate of the third NMOS transistor is connected to the gate and the source of the first NMOS transistor, a source of the third NMOS transistor is connected to the ground terminal, and a drain of the fourth NMOS transistor is connected to the source of the second NMOS transistor.

2. The protection circuit according to claim 1, wherein the first NMOS transistor and the fourth NMOS transistor respectively comprises depletion mode N-channel MOS-FETs, and the second NMOS transistor and the third NMOS transistor respectively comprises enhancement mode N-channel MOSFETs.

3. The protection circuit according to claim 1, further comprising
an output negative voltage protection circuit, wherein
the output negative voltage protection circuit comprises the second NMOS transistor, the third NMOS transistor, and the fourth NMOS transistor.

4. The protection circuit according to claim 1, wherein the external power supply comprises an onboard battery.

5. The protection circuit according to claim 1, wherein the semiconductor integrated circuit comprises a high-side switch comprising an N type semiconductor substrate.

6. The protection circuit according to claim 1, wherein
the first NMOS transistor, the second NMOS transistor, the third NMOS transistor, and the fourth NMOS transistor are formed on an N type semiconductor substrate.

7. A semiconductor integrated circuit apparatus comprising the protection circuit according to claim 1.

8. A protection circuit comprising:
a semiconductor integrated circuit connected to a power terminal, a predetermined power supply voltage being supplied to the power terminal from an external power supply; and
a switch connected to the semiconductor integrated circuit, the switch configured to prevent an electrical conduction to the semiconductor integrated circuit when the external power supply is reverse-connected to the power terminal, wherein
the semiconductor integrated circuit comprises a high-side switch comprising an N type semiconductor substrate, wherein the high-side switch comprises:
a fifth NMOS transistor connected between the power terminal and an output terminal, a load being connected to the output terminal, an operating voltage being supplied to the load;
a drive control unit connected to a gate of the fifth NMOS transistor;
a sixth NMOS transistor disposed between the drive control unit and an input terminal, a control signal being input into the input terminal, a source of the sixth NMOS transistor being connected to the switch through a ground connection terminal;
a negative voltage control unit disposed between the sixth NMOS transistor and the drive control unit;
a first PMOS transistor disposed between the drive control unit and the power terminal, the control signal being input into a gate of the first PMOS transistor; and
a clamp circuit disposed between the power terminal and the gate of the fifth NMOS transistor.

9. The protection circuit according to claim 8, wherein the drive control unit comprises:
a diode, an oscillation circuit, and a booster circuit, each connected in parallel between the first PMOS transistor and the negative voltage control unit; and
a drive circuit connected between the booster circuit, and the gate of the fifth NMOS transistor and the output terminal.

10. A protection circuit comprising:
a semiconductor integrated circuit connected to a power terminal, a predetermined power supply voltage being supplied to the power terminal from an external power supply;
a switch connected to the semiconductor integrated circuit, the switch configured to prevent an electrical conduction to the semiconductor integrated circuit when the external power supply is reverse-connected to the power terminal;
a clamp circuit unit inserted between the power terminal and a ground terminal; and
a protection circuit unit configured to protect the clamp circuit unit from a breakdown when the external power supply is reverse-connected to the power terminal, wherein the clamp circuit unit comprises:
an NMOS transistor of which a drain is connected to the power terminal;
a first Zener diode of which a cathode is connected to the drain of the NMOS transistor;
a second Zener diode of which a cathode is connected to an anode of the first Zener diode;
a third Zener diode of which a cathode is connected to an anode of the second Zener diode;
a fourth Zener diode of which a cathode is connected to an anode of the third Zener diode;
a fifth Zener diode of which a cathode is connected to an anode of the fourth Zener diode;

a sixth Zener diode of which a cathode is connected to an anode of the fifth Zener diode;
a seventh Zener diode of which a cathode is connected to an anode of the sixth Zener diode;
an eighth Zener diode of which a cathode is connected to an anode of the seventh Zener diode;
a ninth Zener diode of which a cathode is connected to an anode of the eighth Zener diode;
a tenth Zener diode of which an anode is connected to an anode of the ninth Zener diode, the tenth Zener diode of which a cathode is connected to a gate of the NMOS transistor;
a resistance element connected between the gate and a source of the NMOS transistor;
an eleventh Zener diode of which a cathode is connected to the gate of the NMOS transistor; and
a twelfth Zener diode of which a cathode is connected to an anode of the eleventh Zener diode.

11. The protection circuit according to claim 10, wherein the protection circuit unit is connected to the source of the NMOS transistor in series.

12. A protection circuit comprising:
a semiconductor integrated circuit connected to a power terminal, a predetermined power supply voltage being supplied to the power terminal from an external power supply;
a switch connected to the semiconductor integrated circuit, the switch configured to prevent an electrical conduction to the semiconductor integrated circuit when the external power supply is reverse-connected to the power terminal;
a clamp circuit unit inserted between the power terminal and a ground terminal; and
a protection circuit unit configured to protect the clamp circuit unit from a breakdown when the external power supply is reverse-connected to the power terminal,
wherein the protection circuit in series unit is connected to a source of an NMOS transistor of the clamp circuit, and
wherein the protection circuit unit comprises a configuration in which a plurality of Zener diodes are connected to one another in series.

13. The protection circuit according to claim 12, wherein the protection circuit unit is set so that a reverse breakdown voltage by the plurality of the Zener diodes becomes equal to or more than the power supply voltage of the external power supply.

14. The protection circuit according to claim 12, wherein the protection circuit unit is composed by including a serial stage of a plurality of bipolar junction transistors each of which between the base and the collector is short-circuit.

15. An operational method of a protection circuit, the protection circuit configured to protect from a breakdown a semiconductor integrated circuit connected to a power terminal, a predetermined power supply voltage being supplied to the power terminal from an external power supply, the operational method comprising:
interrupting a current path between a ground terminal and the power terminal by means of a switch when the external power supply is reverse-connected to the power terminal, wherein
the switch is an enhancement mode second NMOS transistor, a gate of the second NMOS transistor is connected to a gate and source of a depletion mode first NMOS transistor of which a drain is connected to the power terminal, a drain of the second NMOS transistor is connected to the ground terminal, and a source of the second NMOS transistor is connected to the semiconductor integrated circuit, wherein
a drain of an enhancement mode third NMOS transistor and a gate and a source of a depletion mode fourth NMOS transistor are connected to a backgate of the second NMOS transistor, a gate of the third NMOS transistor is connected to the gate and the source of the first NMOS transistor and a source of the third NMOS transistor is connected to the ground terminal, and a drain of the fourth NMOS transistor is connected to the source of the second NMOS transistor, wherein
with regard to the third NMOS transistor and the fourth NMOS transistor to be connected to the backgate of the second NMOS transistor, a conductive path to the backgate is switched from the third NMOS transistor to the fourth NMOS transistor when the external power supply is reverse-connected to the power terminal.

16. The operational method of the protection circuit according to claim 15, wherein
the switch
is turned off when the external power supply is reverse-connected to the power terminal, and thereby an electrical conduction to the semiconductor integrated circuit is prevented.

* * * * *